US007654857B2

(12) United States Patent  
Morey et al.

(10) Patent No.: US 7,654,857 B2  
(45) Date of Patent: Feb. 2, 2010

(54) DIGITAL MULTIMETER HAVING SEALED INPUT JACK DETECTION ARRANGEMENT

(75) Inventors: Terry G. Morey, Renton, WA (US);
John M. Gilbert, Seattle, WA (US);
Surjit Sanghera, Bothell, WA (US);
Daniel L. Parker, Arlington, WA (US);
Mathew J. Martineau, Seattle, WA (US); Robert L. Huggins, Everett, WA (US)

(73) Assignee: Fluke Corporation, Everett, WA (US)

( * ) Notice: Subject to any disclaimer, the term of this patent is extended or adjusted under 35 U.S.C. 154(b) by 288 days.

(21) Appl. No.: 11/893,092

(22) Filed: Aug. 14, 2007

(65) Prior Publication Data

US 2009/0047841 A1 Feb. 19, 2009

(51) Int. Cl.
*G01R 1/38* (2006.01)
(52) U.S. Cl. .................. 439/489; 324/115; 340/687
(58) Field of Classification Search ............... 439/489, 439/490; 324/114, 115, 116; 340/687
See application file for complete search history.

(56) References Cited

U.S. PATENT DOCUMENTS

| | | | | |
|---|---|---|---|---|
| 2,678,365 | A | * | 5/1954 | Bales ....................... 123/633 |
| 2,742,624 | A | * | 4/1956 | Stevens, Jr. ................ 439/564 |
| 3,270,301 | A | * | 8/1966 | Bengtsson .................. 335/129 |
| 4,033,662 | A | * | 7/1977 | Swiger ...................... 439/488 |
| 5,083,116 | A | * | 1/1992 | Judd ......................... 340/644 |
| 5,222,164 | A | | 6/1993 | Bass, Sr. et al. |
| 5,396,062 | A | | 3/1995 | Eisentraut et al. |
| 5,442,337 | A | | 8/1995 | Hwang |
| 6,043,640 | A | | 3/2000 | Lauby et al. |
| 6,466,003 | B1 | | 10/2002 | Gallavan et al. |
| 7,034,517 | B2 | | 4/2006 | Newcombe |
| 2005/0035767 | A1 | * | 2/2005 | Hardy ....................... 324/538 |

FOREIGN PATENT DOCUMENTS

| | | |
|---|---|---|
| DE | 203657 | 10/1983 |
| DE | 19954182 A1 | 5/2001 |
| JP | 2003173851 | 6/2003 |

OTHER PUBLICATIONS

U.K. Intellectual Property Office Search Report dated Jul. 16, 2008 for corresponding application filed in the U.K.
Fluke Users Manual—Model 187 & 189 True RMS Multimeter, Aug. 2002, Rev. 2, Jun. 2002.
Pending U.S. Appl. No. 11/893,109 filed Aug. 14, 2007.
Pending U.S. Appl. No. 11/893,122 filed Aug. 14, 2007.
Pending U.S. Appl. No. 11/893,093 filed Aug. 14, 2007.
Pending U.S. Appl. No. 11/977,078 filed Oct. 23, 2007.

* cited by examiner

*Primary Examiner*—Neil Abrams
(74) *Attorney, Agent, or Firm*—Nelson Mullins Riley & Scarborough LLP

(57) ABSTRACT

A multimeter for testing a plurality of electrical parameters comprises a case having a plurality of test lead jacks. Each of the test lead jacks includes a unitary conductive socket. Preferably, the sockets are made of metal such as brass. A circuit board located in the case has jack conductors in electrical communication with each of the sockets. A jack detection arrangement is adapted to automatically determine whether a plug is inserted into a respective one of the sockets based on a change in electrical characteristics. For example, the jack detection arrangement may include a photonic emitter and a photonic detector situated such that a beam path therebetween is interrupted by insertion of a plug. The case may further have a rotary selector knob for selecting a multimeter function.

29 Claims, 7 Drawing Sheets

DIGITAL MULTIMETER HAVING SEALED INPUT JACK DETECTION ARRANGEMENT

BACKGROUND OF THE INVENTION

The present invention relates generally to digital multimeters. More particularly, the invention relates to a digital multimeter having an improved jack detection arrangement.

Digital multimeters (DMMs) function to measure a number of electrical parameters as needed for service, troubleshooting and maintenance. Such parameters may include AC voltage and current, DC voltage and current, resistance and continuity. In some cases, a DMM may measure other parameters such as capacitance and temperature.

A DMM will often be configured as a hand-held unit having a rotary knob by which various functions are selected. A plurality of lead jacks are provided in the case (i.e., housing) of the unit for connection of test leads. The specific jack used may depend on the function that has been selected. An LCD display provides a reading of the tested parameter.

For at least some of the jacks, it is desirable for the multimeter to "know" whether a plug is inserted. This is because the presence of a plug in the jack can create problems if the user has selected certain functions using the rotary knob. Various arrangements have been utilized in the past to detect the presence of a plug. For example, in one such arrangement, the socket in a particular jack has been split into two separate halves. A continuity check across the two halves reveals the presence of a plug. While this arrangement has worked reasonably well, there is room in the art for additional novel arrangements.

Details regarding the construction and operation of multimeters may be discerned from U.S. Pat. Nos. 7,034,517, 6,466,003 and 6,043,640, incorporated herein by reference.

SUMMARY OF THE INVENTION

According to one aspect, the present invention provides a multimeter comprising a case having a plurality of test lead jacks, each jack including a unitary conductive socket. Preferably, the sockets are made of metal such as brass. A circuit board located in the case has jack conductors in electrical communication with each of the sockets. A jack detection arrangement is adapted to automatically determine whether a plug is inserted into a respective one of the sockets based on a change in electrical characteristics. The case may further have a rotary selector knob for selecting a multimeter function.

Preferably, an inside of each socket is isolated from an interior of the case. For example, the sockets may be molded into the case. In addition, each of the sockets may define a threaded hole in a bottom portion thereof for receipt of a connection screw. The socket in such embodiments is connected to the jack conductors via the connection screw. The printed circuit board preferably defines a plurality of jack apertures in which respective test lead jacks are received. The jack conductors may be formed by a respective conductive strap associated with each of the jack apertures.

In presently preferred embodiments, the jack detection arrangement may include circuitry operative to monitor the jacks for a change in electrical characteristics. For example, a photonic emitter and a photonic detector may be situated such that a beam path therebetween is interrupted by insertion of the plug. In some embodiments, the photonic emitter and detector are located on opposite sides of the socket, with the socket defining lateral openings for the beam path. Preferably, the photonic emitter and the photonic detector may be mounted to the circuit board.

Embodiments are also contemplated in which each of the sockets is molded into a transparent portion of the case. Preferably, the circuitry may utilize a single photonic emitter for an adjacent pair of jacks. The photonic emitter may comprise an infrared light emitting diode.

According to another aspect, the present invention provides a multimeter comprising a case having a rotary selector knob for selecting a multimeter function. The case further has a plurality of test lead jacks, each of which includes a unitary conductive socket isolated from an interior of the case. A jack detection arrangement includes a photonic emitter and a photonic detector situated such that a beam path therebetween is interrupted by insertion of a plug into one of the sockets.

A further aspect of the present invention provides a method of detecting the presence of a plug inserted into a socket. One step of the method involves providing a metallic socket having a pair of aligned lateral openings. According to another step, a photonic emitter is located so as to provide a beam of photonic energy across an interior of the socket through the lateral openings. A photonic detector is located in position to detect the beam of photonic energy. Another step involves determining based on a signal at the photonic detector whether the plug is inserted into the socket. Preferably, the photonic emitter may be operative to emit photonic energy in a periodic manner.

Another aspect of the present invention is provided by a jack detection arrangement for an electronic device. The jack detection arrangement comprises at least one jack including a metallic socket having a pair of aligned lateral openings. A photonic emitter is located on one side of the socket. A photonic detector is situated on an opposite side of the socket such that a beam path through the aligned lateral openings of the socket can be detected. Circuitry in electrical communication with the photonic emitter and photonic detector is operative to determine whether a plug is inserted in the socket.

Other objects, features and aspects of the present invention are provided by various combinations and subcombinations of the disclosed elements, as well as methods of practicing same, which are discussed in greater detail below.

BRIEF DESCRIPTION OF THE DRAWINGS

A full and enabling disclosure of the present invention, including the best mode thereof, to one of ordinary skill in the art, is set forth more particularly in the remainder of the specification, including reference to the accompanying drawings, in which.

Figure 1:
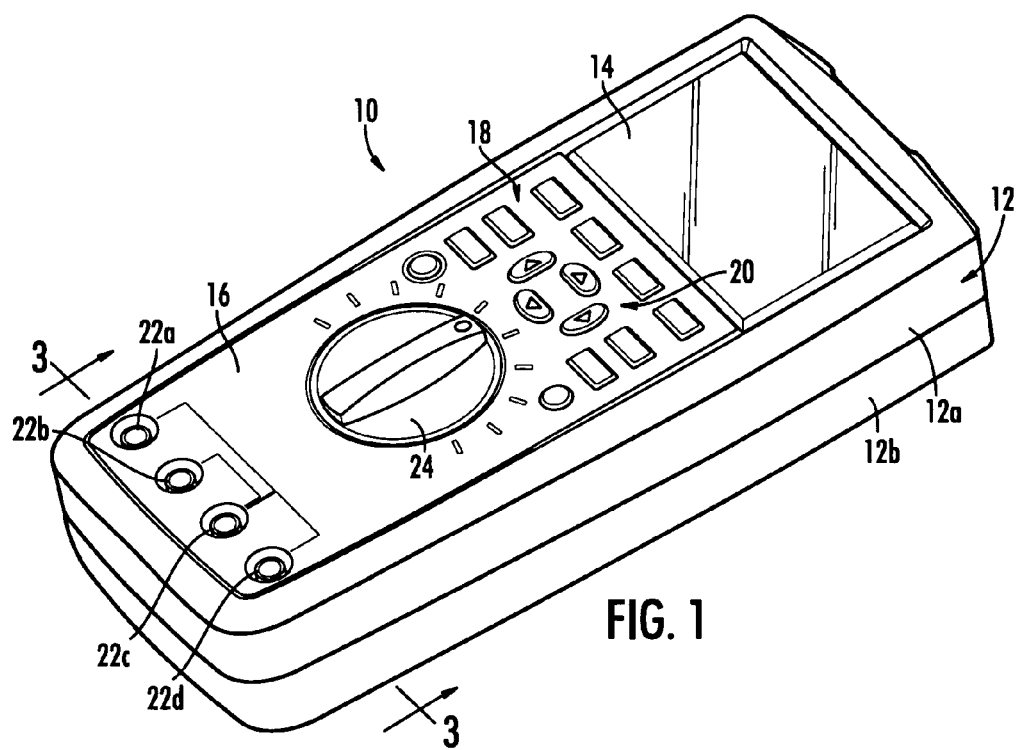
FIG. 1 is a perspective view of a digital multimeter constructed in accordance with the present invention.

Repeat use of reference characters in the present specification and drawings is intended to represent same or analogous features or elements of the invention.

DETAILED DESCRIPTION OF PREFERRED EMBODIMENTS

It is to be understood by one of ordinary skill in the art that the present discussion is a description of exemplary embodiments only, and is not intended as limiting the broader aspects of the present invention, which broader aspects are embodied in the exemplary constructions.

FIG. 1 illustrates a digital multimeter (DMM) 10 constructed in accordance with the present invention. Multimeter 10 comprises a housing having a case 12 defining an interior cavity in which various internal components are located. In this embodiment, case 12 is preferably formed having top and bottom case members 12a and 12b which together define the interior cavity. Preferably, each of the case members 12a and 12b may be formed of a molded shell of high impact rigid plastic which is at least partially overmolded with a softer polymeric material.

The softer material provides a desirable gripping surface. The molded shell of the bottom case member may be opaque, whereas embodiments are contemplated in which the molded shell of the top case member is transparent. The transparent material of top case member 12a provides a window 14 through which a suitable display, such as a liquid crystal display (LCD), can be viewed. Preferably, a separate front panel (or "skin") 16 is received in a corresponding recess defined in top case member 12a. Panel 16, which is preferably formed of an opaque and rigid polymeric material, defines various apertures and other features necessary for a particular multimeter model.

A plurality of keys (collectively indicated at 18) provide a user interface. As shown, these keys may include directional navigation buttons (as indicated at 20). A plurality of jacks 22a-d are also provided for connection of respective test leads. As will be described in more detail below, jacks 22a-d are preferably formed by embedding conductive sockets into top case member 12a during the molding process.

A rotary selector knob 24 allows the user to select a particular multimeter function. In this embodiment, ten such functions are indicated by respective stop positions in the knob rotation. As one skilled in the art will appreciate, suitable graphics will typically be printed on the top surface of panel 16 to indicate the respective function.

Figure 2:
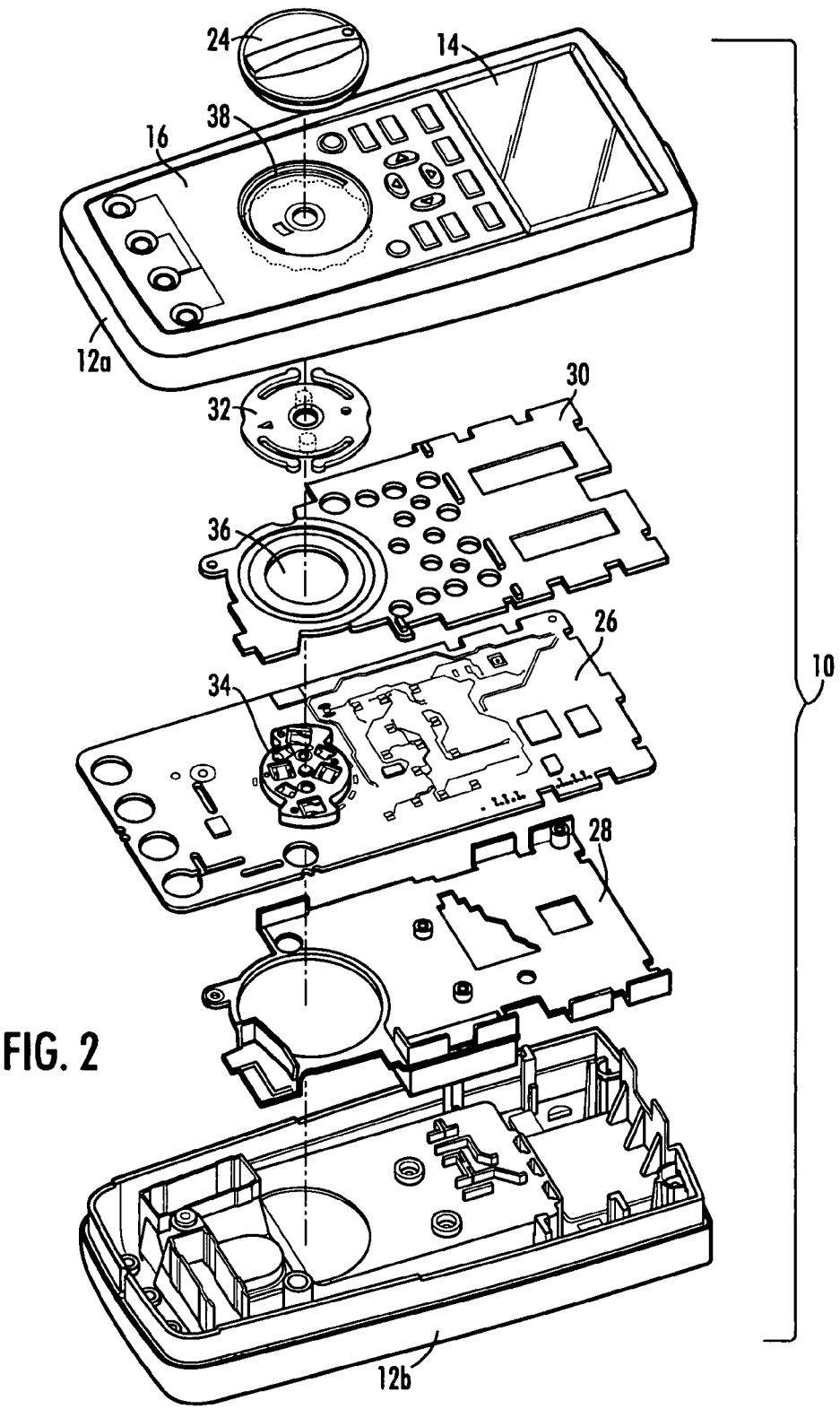
FIG. 2 is an exploded view showing various components of the multimeter of FIG. 1.

Certain additional details about the construction of multimeter 10 can be most easily explained with reference to FIG. 2. Various electronic components necessary for operation of multimeter 10 are mounted to a circuit board 26 within the interior cavity of case 12. Portions of circuit board 26 are covered by a bottom shield 28 and a top shield 30 to reduce the effects of interference on the operation of multimeter 10.

Selector knob 24 includes a depending shaft by which it is connected to a rotary switch assembly mounted to circuit board 24. Preferably, a suitable detent mechanism 32 divides rotation of selector knob 24 into discrete increments. As a result, selector knob 24 will remain in the selected position until the user intentionally moves the knob to a new position. Detent mechanism 32 is in turn connected to a rotary switch member 34 located on circuit board 26. An opening 36 may be defined in top shield 30 to allow the desired interconnection between detent mechanism 32 and rotary switch member 34.

A stop feature is preferably provided to limit rotation of knob 24 in both clockwise and counterclockwise directions. In this embodiment, the stop feature comprises an arcuate groove 38 defined in the surface of panel 16. Groove 38 receives a protrusion located on the bottom of selector knob 24. When the protrusion engages the end faces of groove 38, further rotation is prevented.

Figure 3:
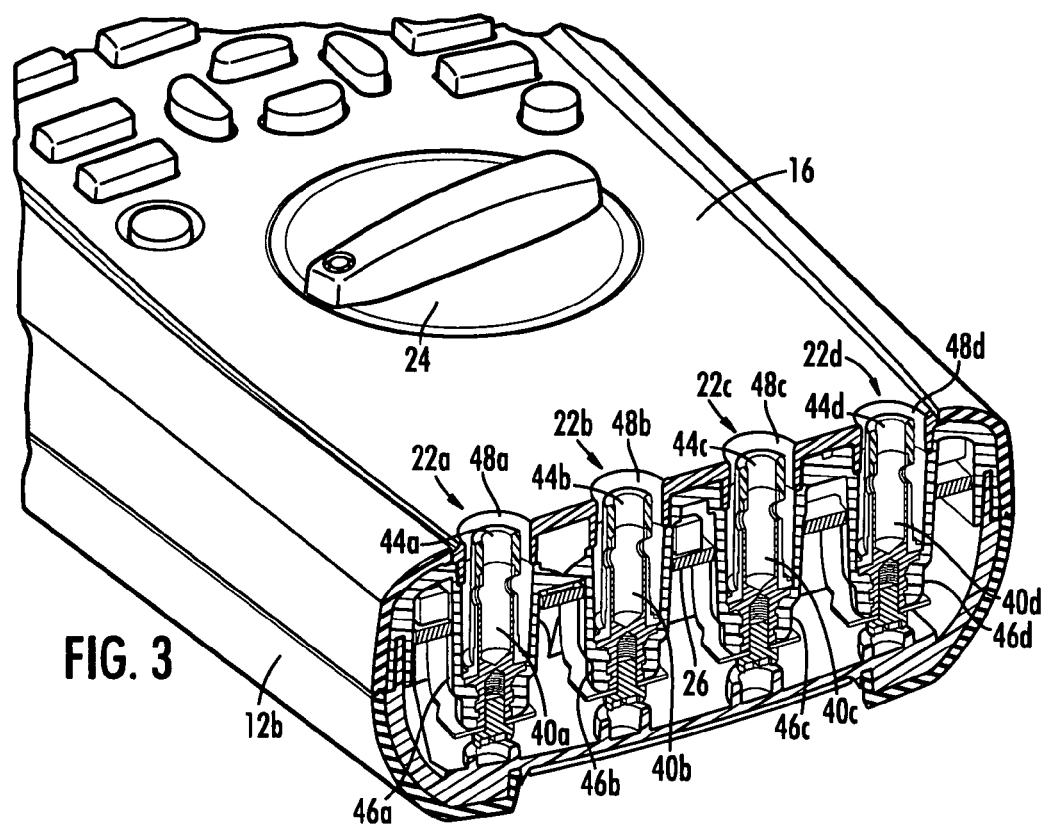
FIG. 3 is a cross-sectional view along line 3-3 of FIG. 1 showing the construction of the input jacks.
Figure 4:
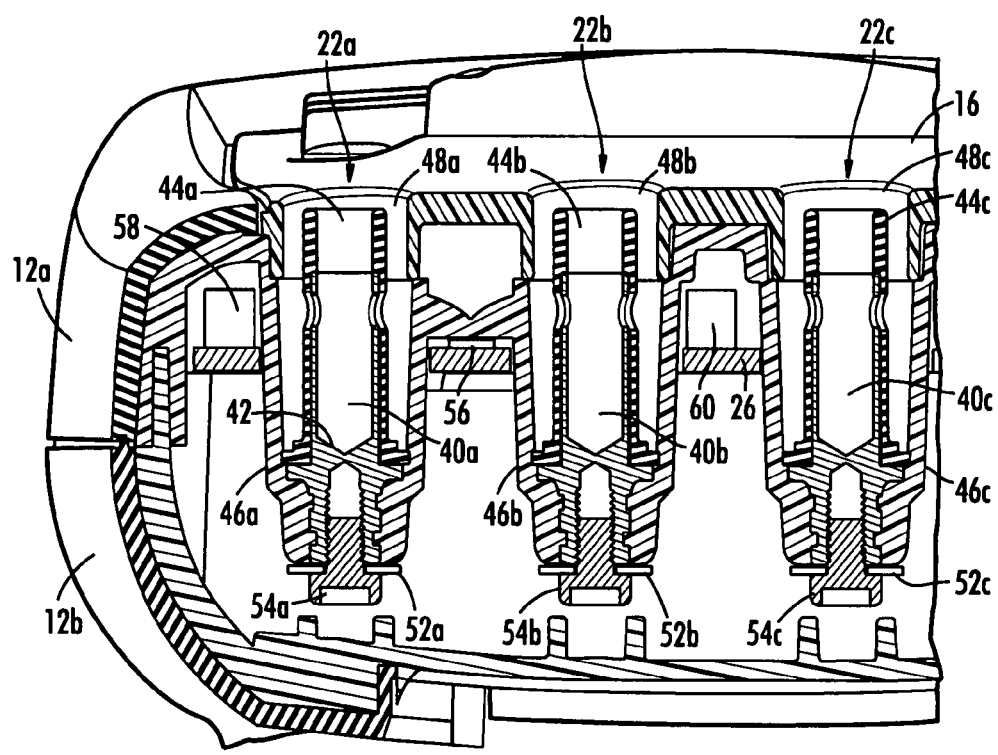
FIG. 4 is a cross-sectional view similar to FIG. 3 but enlarged to show three of the input jacks.

Referring now to FIGS. 3 and 4, jacks 22a-d preferably include a respective unitary socket 40a-d molded into top case member 12a. In presently preferred embodiments, the sockets are formed such that the inside of a respective socket will be isolated from the interior of case 12. In other words, the bottom portions of the sockets are closed (as indicated at 42 in FIG. 4) so that moisture or other contaminants in the ambient environment cannot penetrate at this location. In presently preferred embodiments, the sockets may be formed of a suitable metal, such as brass. A colored sheath 44a-d may be pressed onto the respective socket 40a-d prior to molding in order to indicate the polarity of the jack. For example, sheaths 44a-d may be formed of nonconductive polymer colored either red or black as desired.

After molding, sockets 40a-d (and their corresponding sheaths 44a-d) are mounted into a respective boss 46a-d formed as a integral part of top case member 12a. As noted above, the inner shell of top case member 12a is preferably formed of a transparent plastic material in many preferred embodiments of the invention. As such, bosses 46a-d will be desirably transparent. Panel 16 defines jack apertures 48a-d in register with bosses 46a-d, respectively.

Figure 5:
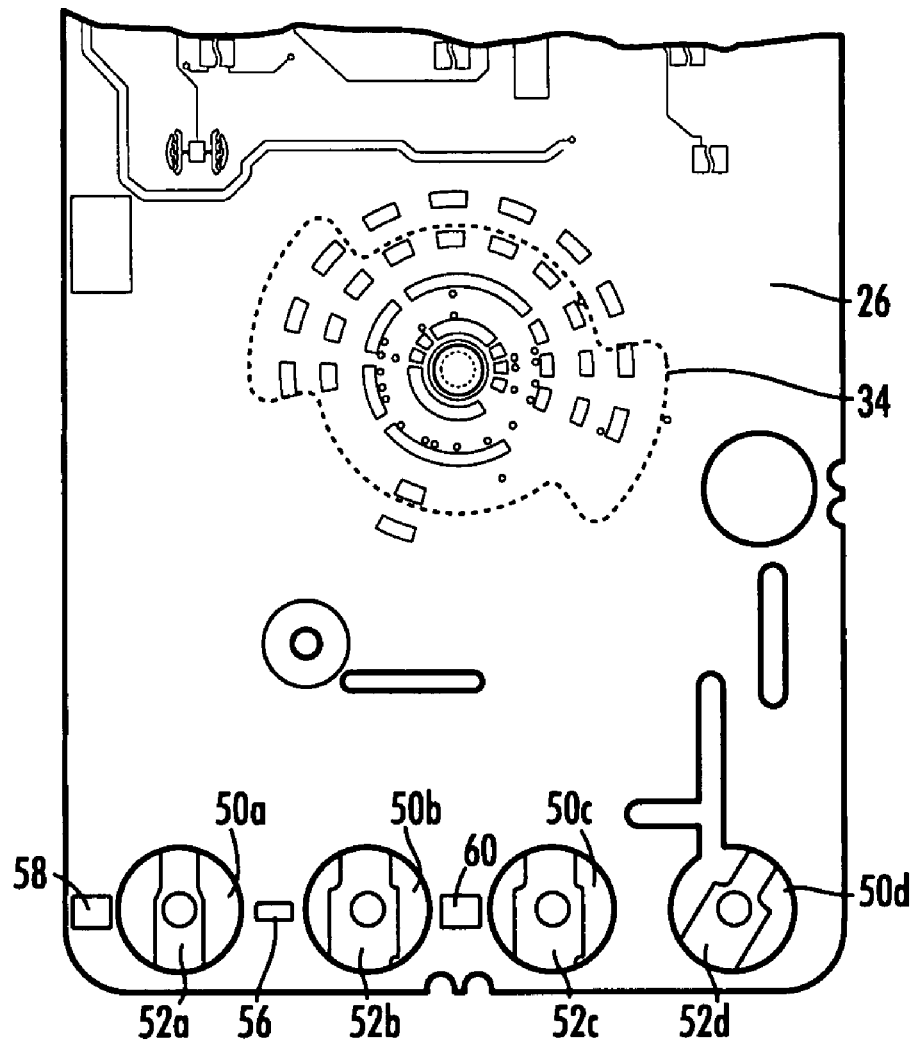
FIG. 5 is an enlarged plan view showing a portion of the printed circuit board of FIG. 2.
Figure 6:
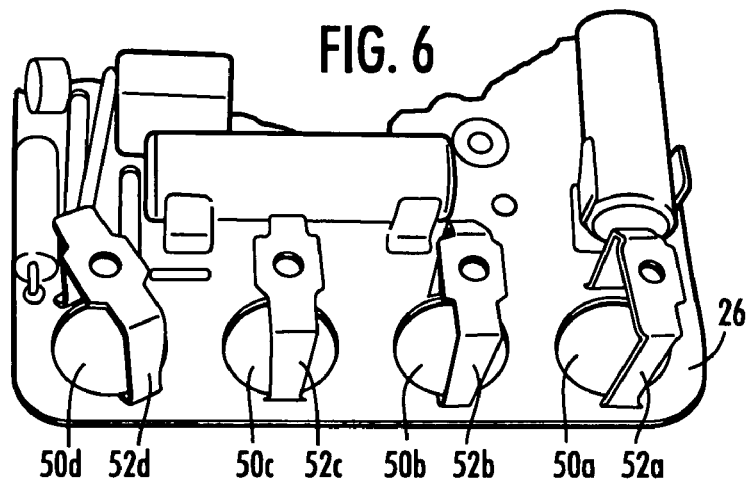
FIG. 6 is a perspective view of the bottom of the portion of the printed circuit board shown in FIG. 5.
Figure 7:
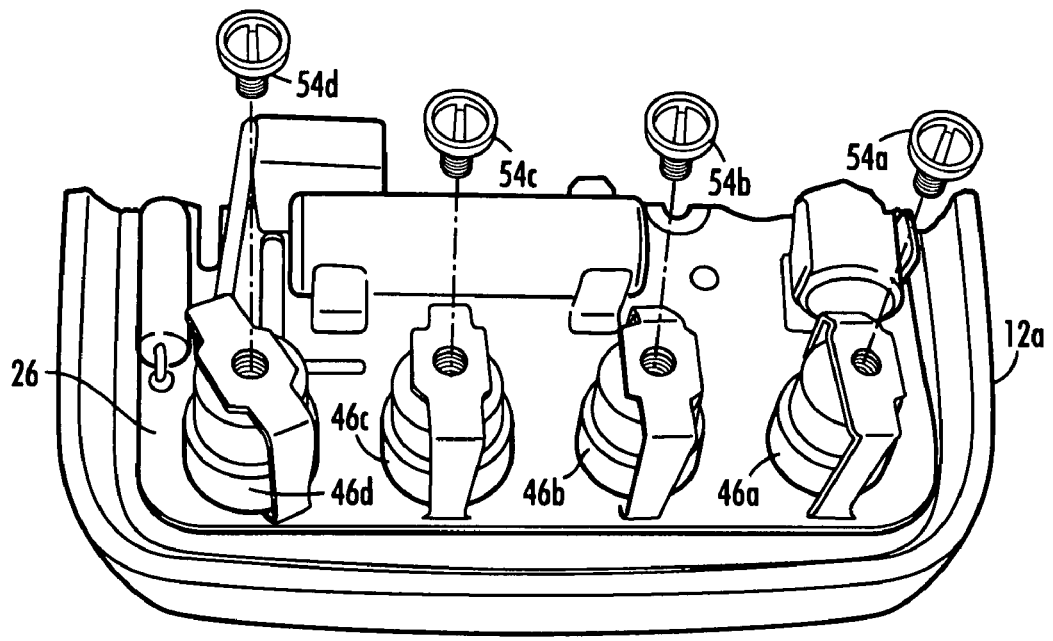
FIG. 7 is a view similar to FIG. 6 but with input jacks molded into the top case member inserted into corresponding apertures in the printed circuit board.

Referring now to FIGS. 5-7, circuit board 26 defines a series of boss apertures 50a-d in which respective bosses 46a-d are received. A respective conductive strap 52a-d is associated with each of the boss apertures 50a-d. The conductive straps are each connected to a respective socket 40a-d in order to provide electrical communication between the associated jack and the appropriate circuitry on circuit board 26. In this embodiment, for example, the conductive straps 52a-d each have a hole by which a respective screw 54a-d (FIG. 7) can be threadably received in the bottom of the associated socket.

Multimeter 10 is adapted so that the presence of a plug is automatically detected in at least some of jacks 22a-d. In the illustrated embodiment, for example, the presence of a plug is automatically detected in jacks 22a and 22b. As shown in FIG. 4, photonic emitter 56 is located on circuit board 26 between jacks 22a and 22b. Respective photonic detectors 58 and 60 are located on the other side of each jack 22a and 22b as seen from emitter 56. In this case, emitter 56 and detectors 58, 60 are configured to operate in the infrared range of the electromagnetic spectrum. In this regard, emitter 56 may be a suitable infrared light emitting diode (IR-LED). One skilled in the art appreciate, however, that principles of the invention are also applicable to other suitable wavelengths.

Figure 8:
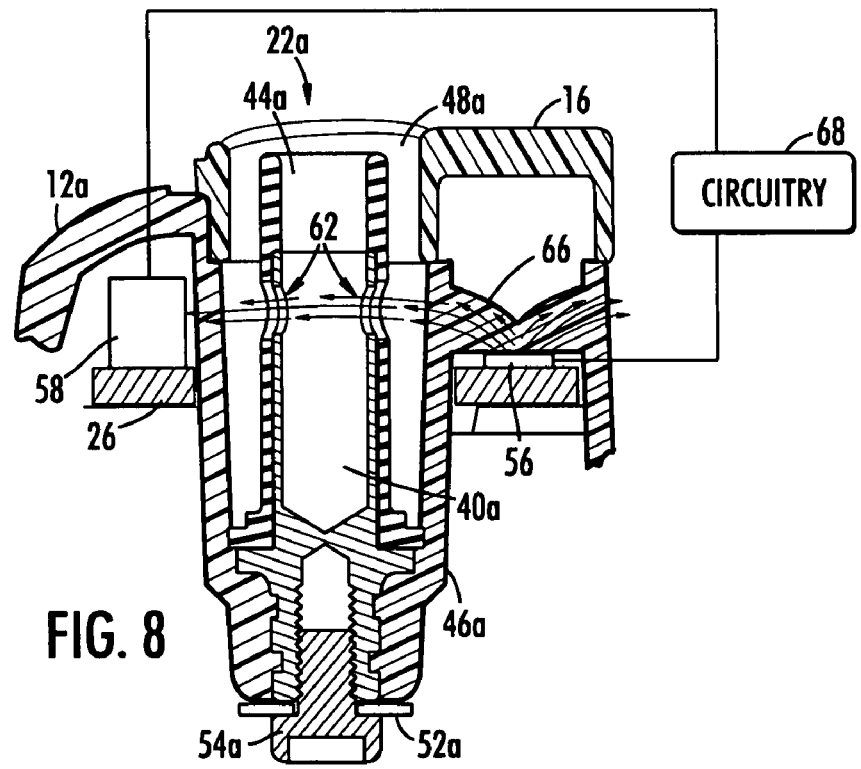
FIGS. 8 and 9 are simplified diagrammatic illustrations showing a manner of detecting insertion of a plug in accordance with the present invention.
Figure 9:
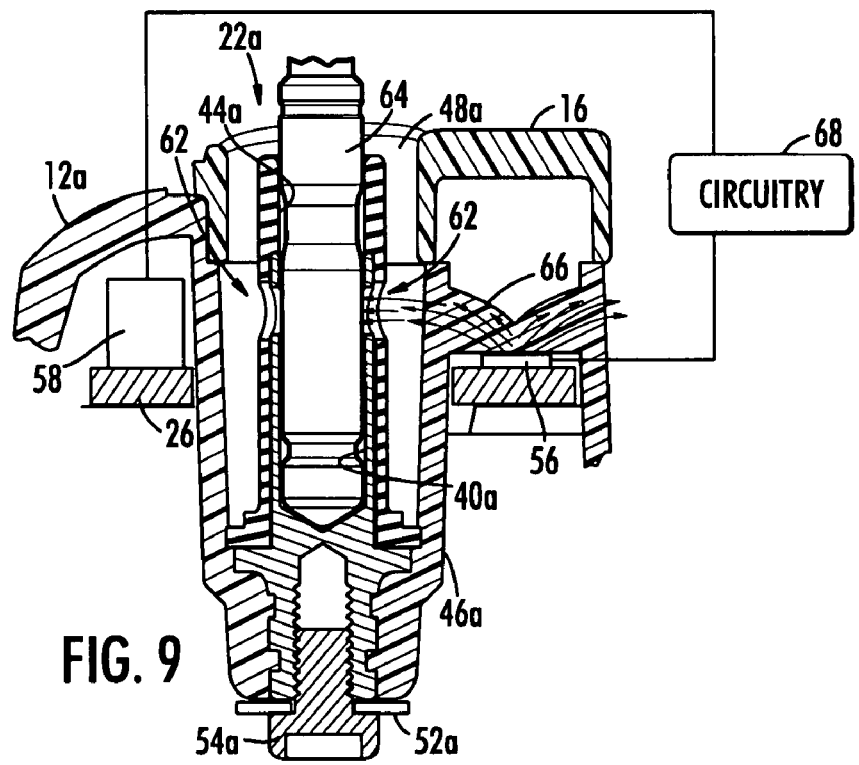

The operation of the jack detection arrangement in the illustrated embodiment can be most easily described with reference to FIGS. 8 and 9. In this embodiment, at least sockets 40a-b and their corresponding sheaths 44a-b have a pair lateral holes 62 in alignment with each other across the inside of the socket. Holes 62 are positioned to provide a beam path between emitter 56 and the associated detector 58, 60. As a result, photonic energy will pass unimpeded from emitter 56 to the detector 58, 60 when no plug is inserted in the jack. As shown in FIG. 9, the beam path is interrupted when a plug 64 is inserted in the jack, thus eliminating (or at least significantly attenuating) the expected signal received by detector.

As noted above, the illustrated embodiment utilizes a single emitter 56 for adjacent jacks 22a and 22b. In this regard, top case member 12a is preferably formed having a light pipe structure 66 that splits the photonic energy emanating from emitter 56 at a right angle to the desired beam path. As can be seen, light pipe structure 66 has a shape resembling one-half of an hourglass in the illustrated embodiment. Because the shell of top case member 12a is transparent, light pipe structure 66 can be easily formed during the molding process. A portion of the photonic energy will travel towards jack 22a while the remaining portion will travel towards jack 22b. The photonic energy travels through the respective jack boss because it is transparent as well (at least in the frequencies of interest). The opaque nature of panel 16 tends to reduce interference from ambient sources.

Appropriate circuitry 68 located on printed circuit board 26 is used to drive emitter 56 as well as to detect the output of detectors 58, 60. Various techniques may be utilized to distinguish between the desired signal (indicating the presence or absence of a plug) and various sources of interference. In some exemplary embodiments, for example, circuitry 68 may be configured to produce a pulse at emitter 56 at a predetermined periodic rate. Circuitry 68 then "knows" that a corresponding signal should be received at detectors 58, 60 unless a plug is inserted. As a result, background interference can be disregarded by circuitry 68.

While an optical technique for detecting the presence or absence of a plug has been described above, one skilled in the art will appreciate that other techniques may be utilized in accordance with the present invention. For example, circuitry can be provided to detect a change in capacitance produced when a plug is inserted. This may be accomplished using an oscillation circuit in which the frequency of oscillation changes with plug insertion.

It can thus be seen that the present invention provides a digital multimeter having a novel jack detection arrangement. While preferred embodiments of the invention have been shown and described, modifications and variations may be made thereto by those of ordinary skill in the art without departing from the spirit and scope of the present invention. In addition, it should be understood that aspects of the various embodiments may be interchanged both in whole or in part. Furthermore, those of ordinary skill in the art will appreciate that the foregoing description is by way of example only, and is not intended to be limitative of the invention as further described in the appended claims.

What is claimed is:

1. A multimeter comprising:
   a case having a plurality of test lead jacks including a respective unitary conductive socket;
   a circuit board located in said case, said circuit board having jack conductors in electrical communication with each of said sockets; and
   a jack detection arrangement adapted to automatically determine whether a plug is inserted into a respective one of said sockets based on a change in electrical characteristics.

2. A multimeter as set forth in claim 1, wherein an inside of each of said unitary sockets is formed so as to be isolated from an interior of said case.

3. A multimeter as set forth in claim 2, wherein each of said unitary sockets is molded into said case.

4. A multimeter as set forth in claim 2, wherein each of said sockets defines a threaded hole in a bottom portion thereof for receipt of a connection screw, each said socket being connected to said jack conductors via said connection screw.

5. A multimeter as set forth in claim 4, wherein said printed circuit board defines a plurality of jack apertures in which respective test lead jacks are received, said jack conductors being formed by a respective conductive strap associated with each of said jack apertures.

6. A multimeter as set forth in claim 2, wherein each of said unitary sockets is formed of metal.

7. A multimeter as set forth in claim 6, wherein said metal is brass.

8. A multimeter as set forth in claim 1, wherein said case further has a rotary selector knob for selecting a multimeter function.

9. A multimeter as set forth in claim 1, wherein said jack detection arrangement includes circuitry operative to monitor said jacks for said change in electrical characteristics.

10. A multimeter as set forth in claim 9, wherein said circuitry includes a photonic emitter and a photonic detector situated such that a beam path therebetween is interrupted by insertion of said plug.

11. A multimeter as set forth in claim 10, wherein said photonic emitter and said photonic detector are located on opposite sides of said socket, said socket defining lateral openings for said beam path.

12. A multimeter as set forth in claim 11, wherein said photonic emitter and said photonic detector are mounted to said circuit board.

13. A multimeter as set forth in claim 12, wherein each of said unitary sockets is molded into a transparent portion of said case.

14. A multimeter as set forth in claim 13, wherein said circuitry utilizes a single said photonic emitter for an adjacent pair of said jacks.

15. A multimeter as set forth in claim 10, wherein said photonic emitter comprises an infrared light emitting diode.

16. A multimeter comprising:
    a case having a rotary selector knob for selecting a multimeter function;
    said case further having a plurality of test lead jacks including a respective unitary conductive socket isolated from an interior of said case; and
    a jack detection arrangement including a photonic emitter and a photonic detector situated such that a beam path therebetween is interrupted by insertion of a plug into one of said sockets.

17. A multimeter as set forth in claim 16, wherein each of said unitary sockets is molded into a transparent portion of said case.

18. A multimeter as set forth in claim 17, wherein said photonic emitter and said photonic detector are located on opposite sides of said plug, said socket defining lateral openings for said beam path.

19. A multimeter as set forth in claim 18, wherein said circuitry utilizes a single said photonic emitter for an adjacent pair of said jacks.

20. A multimeter as set forth in claim 16, wherein each of said sockets defines a threaded hole in a bottom portion thereof for receipt of a connection screw.

21. A multimeter as set forth in claim 16, further comprising a printed circuit board defining a plurality of jack apertures in which respective test lead jacks are received, said sockets of said respective test lead jacks being connected to a respective conductive strap associated with each of said jack apertures.

22. A multimeter as set forth in claim 21, wherein said photonic emitter and said photonic detector are mounted to said circuit board.

23. A multimeter as set forth in claim 22, wherein said photonic emitter comprises an infrared light emitting diode.

24. A method of detecting the presence of a plug inserted into a socket, said method comprising steps of:
 (a) providing a metallic socket having a pair of aligned lateral openings;
 (b) mounting said metallic socket in transparent rigid plastic;
 (c) locating a photonic emitter so as to provide a beam of photonic energy across an interior of said socket through said lateral openings and said transparent rigid plastic;
 (d) locating a photonic detector in position to detect said beam of photonic energy; and
 (e) determining based on a signal at said photonic detector whether said plug is inserted into said socket.

25. A method as set forth in claim 24, wherein said photonic emitter is operative to emit photonic energy in a periodic manner.

26. A method as set forth in claim 24, wherein said photonic emitter is mounted at a right angle with respect to said beam path through said aligned lateral openings.

27. A method as set forth in claim 26, wherein said photonic emitter comprises an infrared light emitting diode.

28. A jack detection arrangement for an electronic device comprising:
 a first jack including a first metallic socket mounted in transparent rigid plastic, said first metallic socket having a pair of aligned lateral openings;
 a second jack including a second metallic socket mounted in transparent rigid plastic, said second metallic socket having a pair of aligned lateral openings;
 a photonic emitter located on one side of said first metallic socket and on one side of said second metallic socket;
 a first photonic detector situated on an opposite side of said first metallic socket from said photonic emitter such that a beam path through said aligned lateral openings of said first metallic socket can be detected;
 a second photonic detector situated on an opposite side of said second metallic socket from said photonic emitter such that a beam path through said aligned lateral openings of said second metallic socket can be detected;
 said photonic emitter operative to provide photonic energy to both of said photonic detectors; and
 circuitry in electrical communication with said photonic emitter and both of said photonic detectors and operative to determine whether a plug is inserted in at least one of said sockets.

29. A jack detection arrangement as set forth in claim 28, wherein said photonic emitter comprises an infrared light emitting diode.

\* \* \* \* \*